(12) United States Patent
Lin et al.

(10) Patent No.: US 9,972,390 B2
(45) Date of Patent: May 15, 2018

(54) TWO PASS MEMORY PROGRAMMING METHOD, MEMORY CONTROL CIRCUIT UNIT AND MEMORY STORAGE APPARATUS

(71) Applicant: PHISON ELECTRONICS CORP., Miaoli (TW)

(72) Inventors: Wei Lin, Taipei (TW); Yu-Cheng Hsu, Yilan County (TW); Szu-Wei Chen, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days. days.

(21) Appl. No.: 15/361,008

(22) Filed: Nov. 24, 2016

(65) Prior Publication Data
US 2018/0101317 A1  Apr. 12, 2018

(30) Foreign Application Priority Data
Oct. 11, 2016  (TW) .............................. 105132771 A

(51) Int. Cl.
*G11C 16/04* (2006.01)
*G06F 3/06* (2006.01)
*G11C 16/34* (2006.01)
*G11C 11/56* (2006.01)
*G06F 11/10* (2006.01)
(Continued)

(52) U.S. Cl.
CPC .............. *G11C 16/04* (2013.01); *G06F 3/064* (2013.01); *G06F 3/0619* (2013.01); *G06F 3/0679* (2013.01); *G06F 11/1068* (2013.01); *G11C 11/5628* (2013.01); *G11C 11/5635* (2013.01); *G11C 11/5642* (2013.01); *G11C 16/0483* (2013.01); *G11C 16/3459* (2013.01); *G11C 29/52* (2013.01); *H03M 13/2957* (2013.01)

(58) Field of Classification Search
CPC .... G06F 3/0619; G06F 3/064; G06F 11/1068; G06F 3/0679; G11C 11/5642; G11C 29/52; G11C 11/5635; G11C 11/5628; G11C 16/3459; G11C 16/0483; H03M 13/2957
See application file for complete search history.

(56) References Cited

U.S. PATENT DOCUMENTS 9,396,804 B1  7/2016 Lin
2004/0047182 A1* 3/2004 Cernea ................. G11C 11/5628
365/185.03
(Continued)

OTHER PUBLICATIONS

"Office Action of Taiwan Counterpart Application," daed Sep. 13, 2017, p. 1-p. 6.

*Primary Examiner* — Ajay Ojha
(74) *Attorney, Agent, or Firm* — JCIPRNET

(57) ABSTRACT

The memory programming method includes: applying a first programming parameter set to program first data stream into a first physical programming unit, and the first physical programming unit is composed of memory cells at intersections between a first bit line string of a physical erasing unit and a first word line layer of the physical erasing unit. The memory programming method further includes applying a second programming parameter set to program the first data stream into all of the memory cells of the first physical programming unit again after completely programming the first data stream into all of the memory cells of the first physical programming unit.

18 Claims, 12 Drawing Sheets

(51) Int. Cl.
*G11C 29/52* (2006.01)
*H03M 13/29* (2006.01)

(56) References Cited

U.S. PATENT DOCUMENTS

| | | | |
|---|---|---|---|
| 2006/0221697 A1* | 10/2006 | Li | G11C 16/3468 365/185.18 |
| 2010/0322000 A1* | 12/2010 | Shim | G11C 11/5628 365/185.03 |
| 2012/0069664 A1* | 3/2012 | Kim | G11C 16/0483 365/185.11 |
| 2014/0281769 A1 | 9/2014 | Ohshima | |
| 2015/0325298 A1* | 11/2015 | D'Abreu | G11C 16/10 365/185.09 |

* cited by examiner

| Lower physical programming unit | Center physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

FIG. 10

TWO PASS MEMORY PROGRAMMING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 105132771, filed on Oct. 11, 2016. The entirety of the above-mentioned patent application is hereby incorporated by reference herein and made a part of this specification.

BACKGROUND

Technical Field

The present invention relates to a memory programming method, and more particularly, relates to a memory programming method for a rewritable non-volatile memory and a memory control circuit unit and a memory storage apparatus using the method.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

In general, a control circuit can store data by applying voltage to word lines (or word line layers) and programming selected memory cells in the rewritable non-volatile memory module through bit lines. Currently, the rewritable non-volatile memory module in which one memory cell storing three data bits has been developed to satisfy the growing demands on large-capacity storage in the market. Nonetheless, as the processing technology becomes more sophisticated, it is also more difficult to correctly identify a threshold voltage distribution in the memory cell storing three data bits. Accordingly, finding a way of ensuring a reliability of the data programmed to the rewritable non-volatile memory module is one of the major issues to be addressed by person skilled in the field.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a memory programming method, a memory control circuit unit and a memory storage apparatus, which are capable of effectively improving the reliability of the stored data.

An exemplary embodiment of the present invention provides a memory programming method for a physical erasing unit of a rewritable non-volatile memory module. The physical erasing unit of the rewritable non-volatile memory includes a plurality of word line layers and a plurality of bit line strings. Each bit line string among the bit line strings is arranged in a first direction and separated from one another. Each bit line string among the bit line strings includes a plurality of bit lines. The bit lines extend in a second direction, and are arranged in a third direction and separated from one another. The word line layers are stacked in the second direction and the word line layers are separated from one another. A memory cell is provided at an intersection between each of the word line layers and each of the bit lines. At least one physical programming unit is composed of the memory cells at the intersections between any one bit line string among the bit line strings and any one word line layer among the word line layers. The memory programming method includes: applying a first programming parameter set to program a first data stream into at least one first physical programming unit of the physical erasing unit, where the first physical programming unit is composed of the memory cells at the intersections between a first bit line string among the bit line strings and a first word line layer among the word line layers. The memory programming method further includes: applying a second programming parameter set to program the first data stream into all of the memory cells of the first physical programming unit again after completely programming the first data stream into all of the memory cells of the first physical programming unit.

An exemplary embodiment of the present invention provides a memory control circuit unit for a rewritable non-volatile memory module. The rewritable non-volatile memory module includes at least one physical erasing unit. The physical erasing unit includes a plurality of word line layers and a plurality of bit line strings. Each bit line string among the bit line strings is arranged in a first direction and separated from one another. Each bit line string among the bit line strings includes a plurality of bit lines. The bit lines extend in a second direction, and are arranged in a third direction and separated from one another. The word line layers are stacked in the second direction and the word line layers are separated from one another. A memory cell is provided at an intersection between each of the word line layers and each of the bit lines. At least one physical programming unit is composed of the memory cells at the intersections between any one bit line string among the bit line strings and any one word line layer among the word line layers. The memory control circuit unit includes a host interface, a memory interface and a memory management circuit. The memory management circuit is coupled to the host interface and the memory interface. The host interface is configured to couple to the host system, and the memory interface is configured to couple to the rewritable non-volatile memory module. The memory management circuit is configured to give a first command sequence for applying a first programming parameter set to program a first data stream into at least one first physical programming unit of the physical erasing unit, where the first physical programming unit is composed of the memory cells at the intersections between a first bit line string among the bit line strings and a first word line layer among the word line layers. The memory management circuit is further configured to give a second command sequence for applying a second programming parameter set to program the first data stream into all of the memory cells of the at least one first physical programming unit again after completely programming the first data stream into all of the memory cells of the at least one first physical programming unit.

An exemplary embodiment of the present invention provides a memory storage apparatus, which includes a connection interface unit configured to couple to a host system, a rewritable non-volatile memory module, and aforesaid memory control circuit unit that is coupled to the connection interface unit and the rewritable non-volatile memory module. The memory control circuit unit includes a host interface, a memory interface and a memory management circuit. The host interface is configured to couple to the host system, the memory interface is configured to couple to the rewritable non-volatile memory module, and the memory management circuit is coupled to the host interface and the memory interface.

Based on the above, the memory programming method, the memory control circuit unit and the memory storage apparatus according to the exemplary embodiments of the invention can effectively improve the reliability of the stored data in order to avoid data loss.

To make the above features and advantages of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 9, FIG. 10, FIG. 11 and FIG. 12 are schematic diagrams illustrating a management of the physical erasing unit according to the first exemplary embodiment.

DESCRIPTION OF THE EMBODIMENTS

Figure 1:
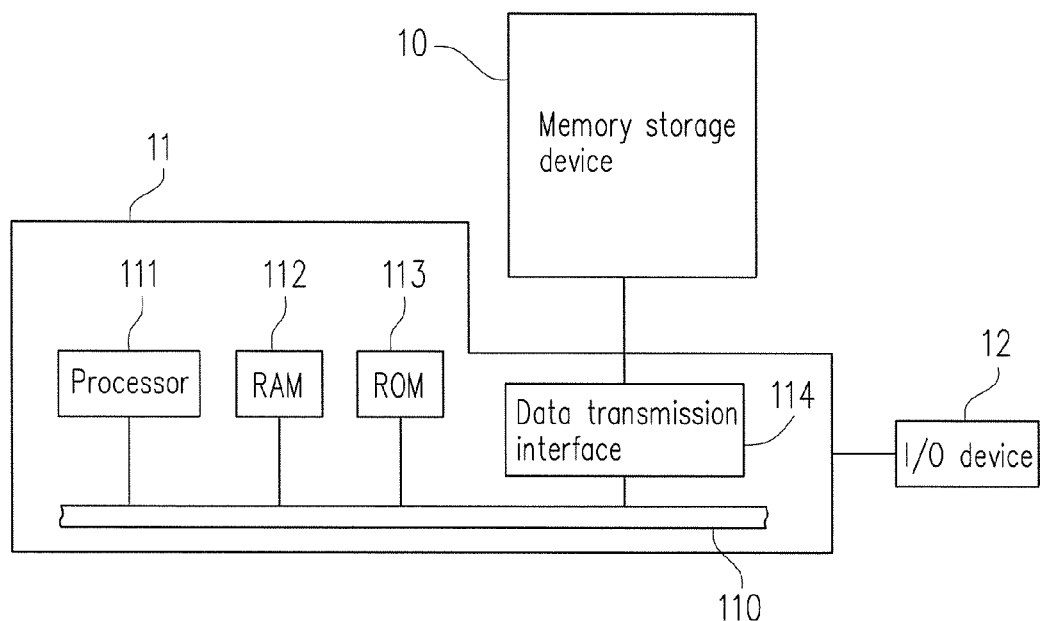
FIG. 1 is a schematic diagram illustrating a host system, a memory storage apparatus and an input/output (I/O) device according to a first exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Some technical terms may be used thereafter, please referring to a term table as follows:

| Technical term | Abbreviation |
|---|---|
| Logical address-physical address mapping table | L2P table |
| Physical address-Logical address mapping table | P2L table |
| Rewritable non-volatile memory module | RNVM module |
| Physical erasing unit | PEU |
| Physical programming unit | PPU |
| Logical erasing unit | LEU |
| Logical programming unit | LPU |
| Memory management circuit | MMC |
| Memory control circuit unit | MCCU |

Generally, a memory storage apparatus (also known as a memory storage system) includes a RNVM module and a controller (also known as a MCCU). The memory storage apparatus is usually configured together with a host system so the host system may write data into the memory storage apparatus or read data from the memory storage apparatus.

First Exemplary Embodiment

Figure 2:
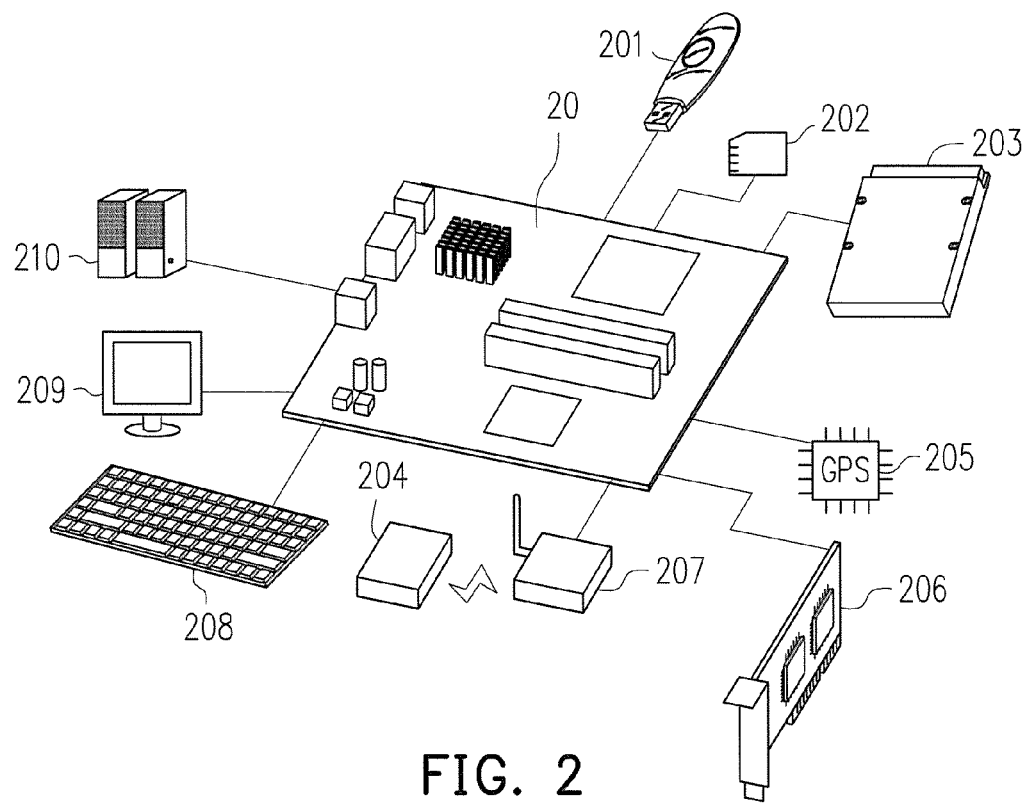
FIG. 2 is a schematic diagram illustrating a host system, a memory storage apparatus and an input/output (I/O) device according to another exemplary embodiment.

FIG. 1 is a schematic diagram illustrating a host system, a memory storage apparatus and an input/output (I/O) device according to the first exemplary embodiment, and FIG. 2 is a schematic diagram illustrating a host system, a memory storage apparatus and an input/output (I/O) device according to another exemplary embodiment.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage apparatus 10 through the data transmission interface 114. For example, the host system 11 can write data into the memory storage apparatus 10 or read data from the memory storage apparatus 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage apparatus 10 in a wired manner or a wireless manner. The memory storage apparatus 10 may be, for example, a flash drive 201, a memory card 202, a SSD (Solid State Drive) 203 or a wireless memory storage apparatus 204. The wireless memory storage apparatus 204 may be, for example, a memory storage apparatus based on various wireless communication technologies, such as a NFC (Near Field Communication Storage) memory storage apparatus, a WiFi (Wireless Fidelity) memory storage apparatus, a Bluetooth memory storage apparatus, a BLE (Bluetooth low energy) memory storage apparatus (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage apparatus 204 via the wireless transmission device 207.

Figure 3:
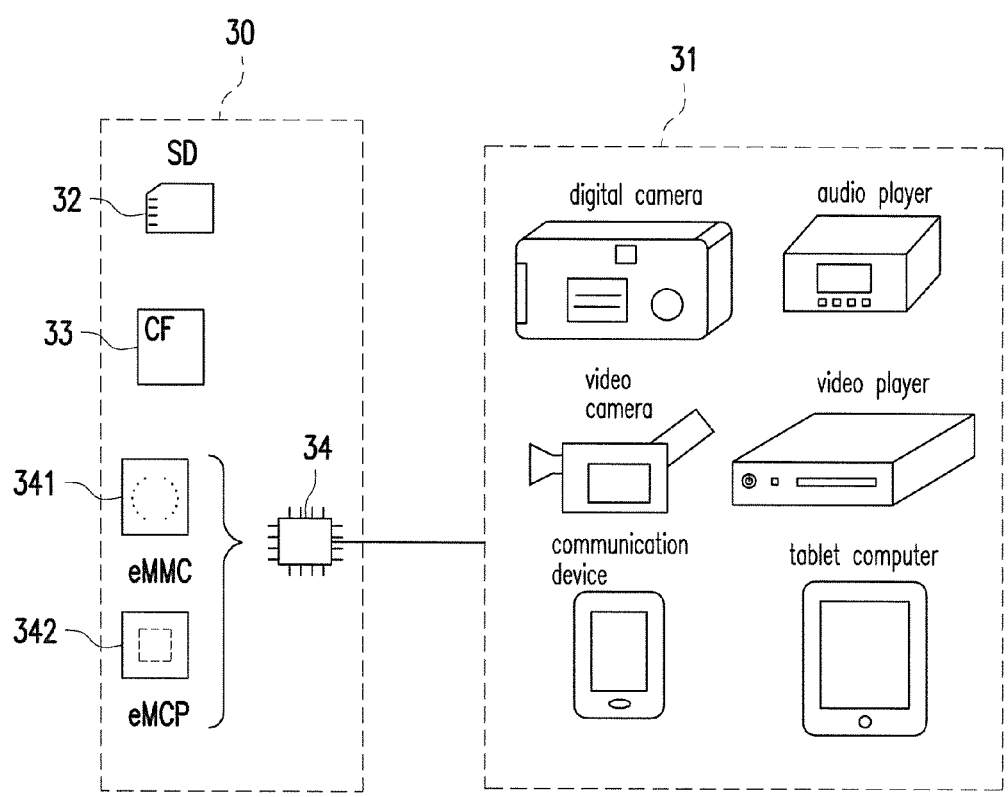
FIG. 3 is a schematic diagram illustrating a host system and a memory storage apparatus according to another exemplary embodiment.

In an exemplary embodiment, aforementioned host system may be any system capable of substantially cooperating with the memory storage apparatus for storing data. In the present exemplary embodiment, the host system is illustrated as a computer system for example. Nonetheless, FIG. 3 is a schematic diagram illustrating a host system and a memory storage apparatus according to another exemplary embodiment. Referring to FIG. 3, in another exemplary embodiment, a host system 31 may also be a system including a digital camera, a video camera, a communication device, an audio player, a video player or a tablet computer, whereas a memory storage apparatus 30 may be various non-volatile memory storage apparatuses used by the host system, such as a SD card 32, a CF card 33 or an embedded storage device 34. The embedded storage device 34 includes various embedded storage devices capable of directly coupling a memory module onto a substrate of the host system, such as an eMMC (embedded Multi Media Card) 341 and/or an eMCP (embedded Multi Chip Package) 342.

Figure 4:
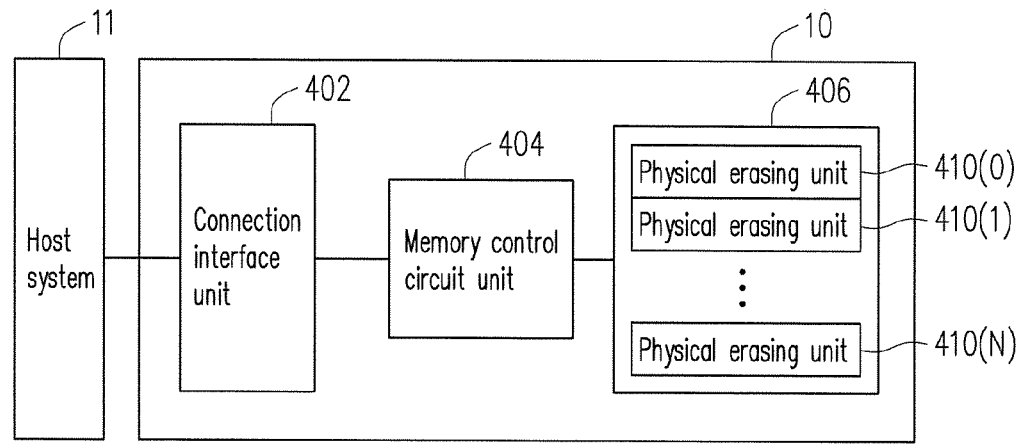
FIG. 4 is a schematic block diagram illustrating the host system and the memory storage apparatus according to the first exemplary embodiment.

FIG. 4 is a schematic block diagram illustrating the host system and the memory storage apparatus according to the first exemplary embodiment.

Referring to FIG. 4, the memory storage apparatus 10 includes a connection interface unit 402, a MCCU 404 and a RNVM module 406.

In the present exemplary embodiment, the connection interface unit 402 is compatible with a Secure Digital (SD) interface standard. Nevertheless, it should be understood that the invention is not limited thereto. The connection interface unit 402 may also be compatible to a SATA (Serial Advanced Technology Attachment) standard, a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a UHS-I (Ultra High Speed-I) interface standard, a UHS-II (Ultra High Speed-II) interface standard, a MS (Memory Stick) interface standard, a Multi-Chip Package interface standard, a Multi Media Card interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. In the present exemplary embodiment, the connection interface unit 402 and the MCCU 404 may be packaged into one chip, or the connection interface unit 402 is distributed outside of a chip containing the MCCU.

The MCCU 404 is configured to execute a plurality of logic gates or control commands which are implemented in a hardware form or in a firmware form and perform operations of writing, reading or erasing data in the rewritable non-volatile memory storage module 406 according to the commands of the host system 11.

The RNVM module 406 is coupled to the MCCU 404 and configured to store data written from the host system 11. The rewritable non-volatile memory storage module 406 includes PEUs 410(0) to 410(N). For example, the PEUs 410(0) to 410(N) may belong to the same memory die or belong to different memory dies. Each PEU has a plurality of PPUs, and the PPUs of the same PEU may be written separately and erased simultaneously. Nevertheless, it should be understood that the invention is not limited thereto. Each PEU may be composed of 64 PPUs, 256 PPUs or any number of the PPUs.

More specifically, the PEU is a minimum unit for erasing. Namely, each PEU contains the least number of memory cells to be erased together. The PPU is the minimum unit for programming. That is, the PPU is the minimum unit for writing data. Each PPU usually includes a data bit area and a redundancy bit area. The data bit area having multiple physical access addresses is used to store user data, and the redundant bit area is used to store system data (e.g., control information and error checking and correcting code). In the present exemplary embodiment, each data bit area of the PPU contains 8 physical access addresses, and the size of each physical access address is 512 byte. However, in other exemplary embodiments, the data bit area may also contain more or less physical access addresses, and the number and size of the physical access addresses are not limited by the invention. For example, in an exemplary embodiment, the PEU is a physical block, and the PPU is a physical page or a physical sector. However, the invention is not limited thereto.

In the present exemplary embodiment, the RNVM module 406 may also be a 3D (Three Dimension) TLC (Trinary Level Cell) NAND flash memory module (i.e., a flash memory module capable of storing three data bits in one memory cell) or other memory module having the same features. However, the invention is not limited thereto. The RNVM module 406 may also be a 3D MLC (Multi Level Cell) NAND flash memory module (i.e., a flash memory module capable of storing two data bits in one memory cell) or other memory module having the same features.

Figure 5:
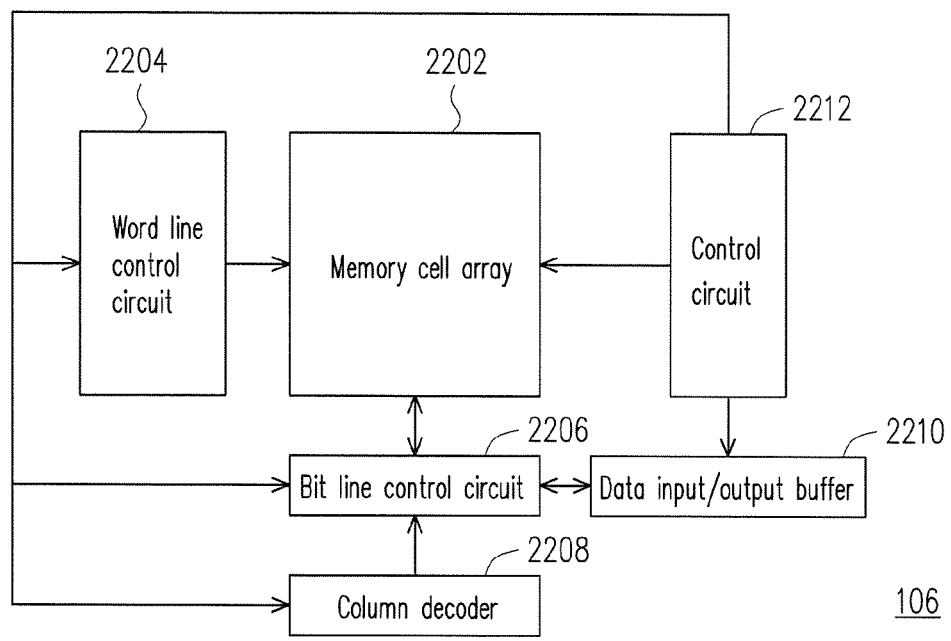
FIG. 5 is a schematic block diagram illustrating a rewritable non-volatile memory module according to the first exemplary embodiment.
Figure 6:
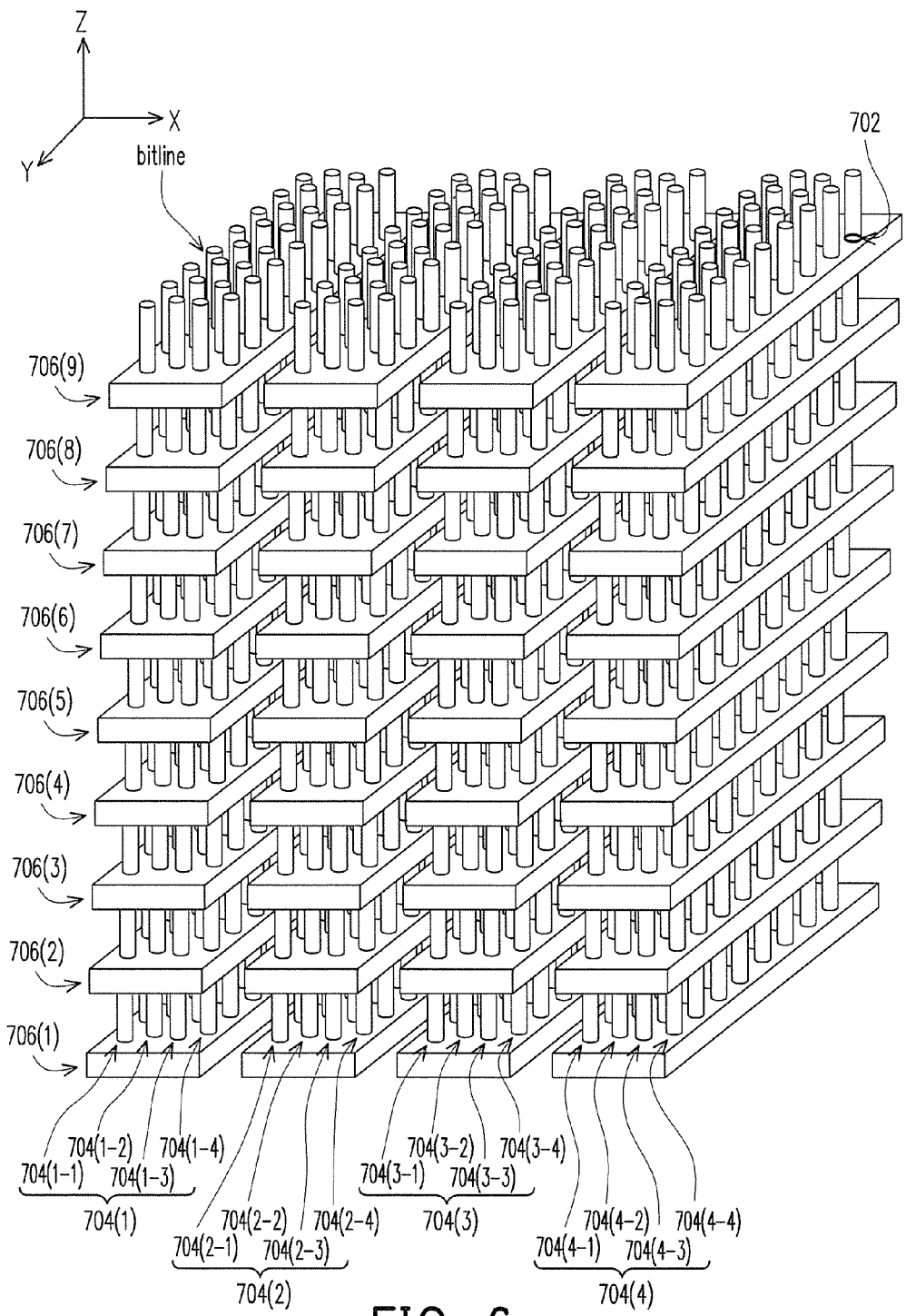
FIG. 6 is a schematic diagram illustrating a memory cell array of the physical erasing unit according to the first exemplary embodiment.

FIG. 5 is a schematic block diagram illustrating a RNVM module according to the first exemplary embodiment, and FIG. 6 is a schematic diagram illustrating a memory cell array of the PEU according to the first exemplary embodiment.

Referring to FIG. 5 and FIG. 6, the RNVM module 406 includes a memory cell array 2202, a word line control circuit 2204, a bit line control circuit 2206, a column decoder 2208, a data input/output buffer 2210 and a control circuit 2212.

With reference to FIG. 5 and FIG. 6, the memory cell array 2202 includes a plurality of memory cells 702 for storing data, a plurality of bit line strings (e.g., a first bit line string 704(1), a second bit line string 704(2), a third bit line string 704(3) and a fourth bit line string 704(4)) and a plurality of word line layers (e.g., a first word line layer 706(1), a second word line layer 706(2), a third word line layer 706(3), a fourth word line layer 706(4), a fifth word line layer 706(5), a sixth word line layer 706(6), a seventh word line layer 706(7), an eighth word line layer 706(8) and a ninth word line layer 706(9)). The PEU is composed of the memory cells 702 in the memory cell array 2202. Specifically, each of the bit line strings include a plurality of bit line sets (e.g., a bit line set 704(1-1), a bit line set 704(1-2), a bit line set 704 (1-3), a bit line set 704(1-4), a bit line set 704 (2-1), a bit line set 704(2-2), a bit line set 704 (2-3), a bit line set 704(2-4), a bit line set 704 (3-1), a bit line set 704(3-2), a bit line set 704 (3-3), a bit line set 704(3-4), a bit line set 704 (4-1), a bit line set 704(4-2), a bit line set 704(4-3) and a bit line set 704(4-4)), and each of the bit line sets is arranged in a first direction and separated from one other. Further, each of the bit line sets includes a plurality of bit lines arranged in a third direction, separated from one another and extending in a second direction (e.g., a tube-shape element in a vertical arrangement passing through each of the word line layers, as shown in FIG. 6). The word line layers are stacked in the second direction and the word line layers are separated from one other. For example, the first direction is X-axis, the second direction is Z-axis and the third direction is Y-axis. The memory cells composing the PEU are located at intersections between each of the word line layers and each of the bit lines of each of the bit line strings. In the present exemplary embodiment, the RNVM module 406 is the 3D TLC NAND flash memory module. Therefore, three PPUs are composed of the memory cells at the intersections between each of the bit line strings and each of the word line layers. In an example where the RNVM module 406 is the 3D MLC NAND flash memory module, two PPUs are composed of the memory cells at the intersections between each of the bit line strings and each of the word line layers. When a write command or a read command is received from the MCCU 404, the control circuit 2212 controls the word line control circuit 2204, the bit line control circuit 2206, the column decoder 2208, the data input/output buffer 2210 to write the data into the memory cell array 2202 or read the data from the memory cell array 2202. Among them, the word line control circuit 2204 is configured to control voltages applied to the word lines 706; the bit line control circuit 2206 is configured to control voltages applied to the bit lines 704; the column decoder 2208 is configured to select the corresponding bit line according to a decoding row address in a command; and the data input/output buffer 2210 is configured to temporarily store the data. The memory cell in the RNVM module 406 uses various gate voltages to represent bits of data. A data writing (or known as programming) operation of the memory cells of the memory cell array 2202 is to apply a voltage to a specific terminal (e.g., controlling the gate voltage to change the amount of electrons in an charge-trapping layer of a gate), so as to change an on-state of a channel of the memory cell in order to present different storage states.

Figure 7:
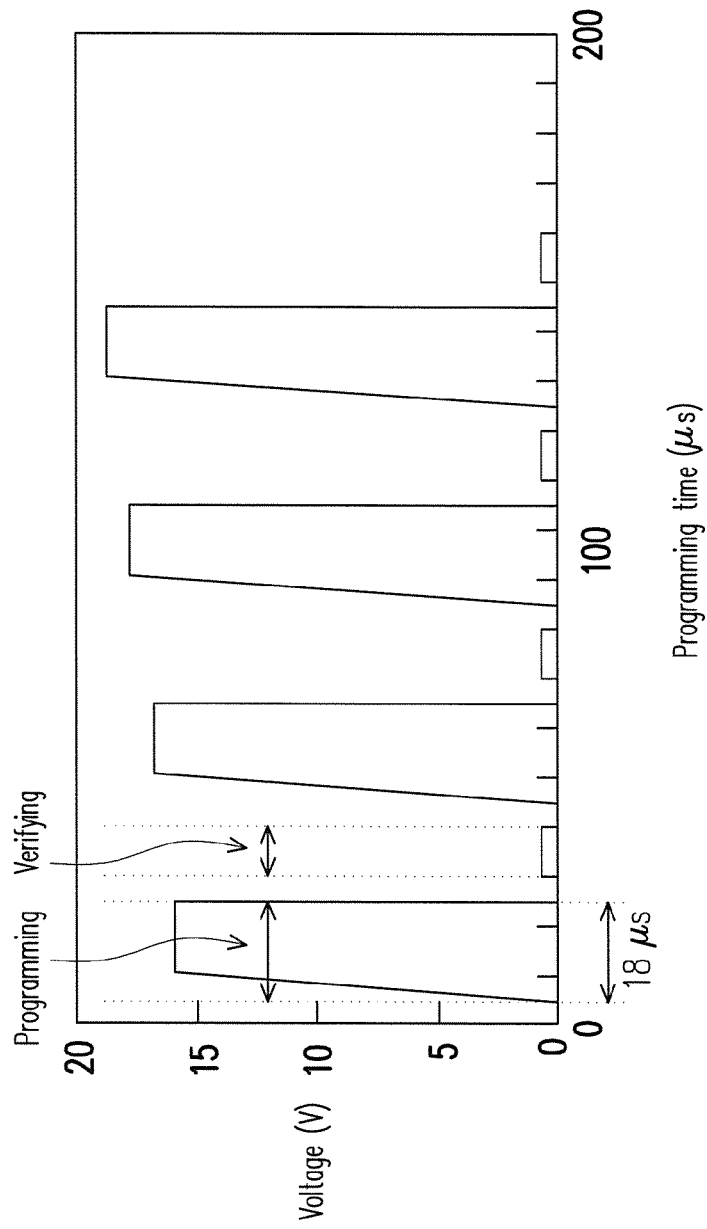
FIG. 7 illustrates a schematic diagram of programming the memory cells according to the first exemplary embodiment.

FIG. 7 illustrates a schematic diagram of programming the memory cells according to the first exemplary embodiment.

Referring to FIG. 7, in the present exemplary embodiment, a programming operation of the memory cell is completed by using a method of pulse writing/verifying threshold voltage. Specifically, when the data is to be written into the memory cells, the MCCU 404 performs the data writing operation by setting an initial write voltage and a write voltage pulse time, and instructing the control circuit 2212 of the RNVM module 406 to program the memory cell by using the set initial write voltage and the write voltage pulse time. Then, the MCCU 404 can use a verify voltage to verify the memory cells, so as determine whether the memory cells are in a correct storage state. If the memory cells are not programmed to the correct storage state, the MCCU 404 instructs the control circuit 2202 to use the currently-applied write voltage plus an Incremental-step-pulse programming (ISPP) adjusted value as a new write voltage (also known as a repeat write voltage) and program the memory cells again by using the new write voltage and the write voltage pulse time. Otherwise, if the memory cells are programmed to the correct storage state, it indicates that the data is correctly written into the memory cells. For example, the initial voltage is set to 16 volts (V), the write voltage pulse time is set to 18 microseconds (μs) and the ISPP adjusted value is set to 0.6V. However, the present disclosure is not limited thereto.

In a reading operation of the memory cells of the memory cell array 2202, a read voltage is applied to a control gate, and data stored in the memory cells can be identified according the on-state of the channel (a path used by the memory cell for electrically connecting the bit line with a source line, such as a path from a source to a drain of the memory cell) of the memory cell.

Figure 8:
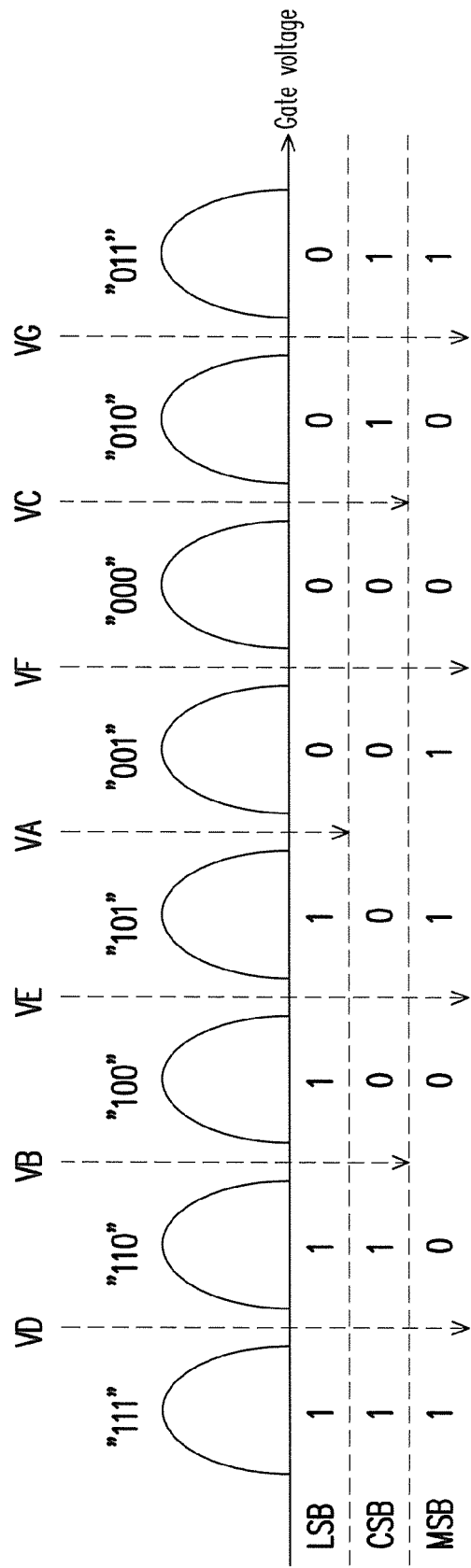
FIG. 8 illustrates a schematic diagram of reading data from the memory cells according to the first exemplary embodiment.

FIG. 8 illustrates a schematic diagram of reading data from the memory cell according to the first exemplary embodiment, which uses the 3D TLC NAND flash memory as an example.

Referring to FIG. 8, in the RNVM module 406, the storage state of the memory cell includes a least significant bit (LSB) which is a first bit counted from the left, a center significant bit (CSB) which is a second bit counted from the left and a most significant bit (MSB) which is a third bit counted from the left. Herein, the LSB corresponds to a lower PPU, the CSB corresponds to a center PPU and the MSB corresponds to an upper PPU. In this example, the gate voltage in each memory cell may be divided into 8 storage states (i.e., "111", "110", "100", "101", "001", "000", "010" and "011") according to a first preset read voltage VA, a second preset read voltage VB, a third preset read voltage VC, a fourth preset read voltage VD, a fifth preset read voltage VE, a sixth preset read voltage VF and a seventh preset read voltage VG. In particular, three PPUs may be composed of the memory cells arranged on the same word line. Herein, the PPU composed of the LSBs of said memory cells is known as a lower PPU, the PPU composed of the CSBs of said memory cells is known as a center PPU, and the PPU composed of the MSBs of said memory cells is known as an upper PPU.

FIG. 9, FIG. 10, FIG. 11 and FIG. 12 are schematic diagrams illustrating a management of the PEU according to the first exemplary embodiment.

Figure 9:
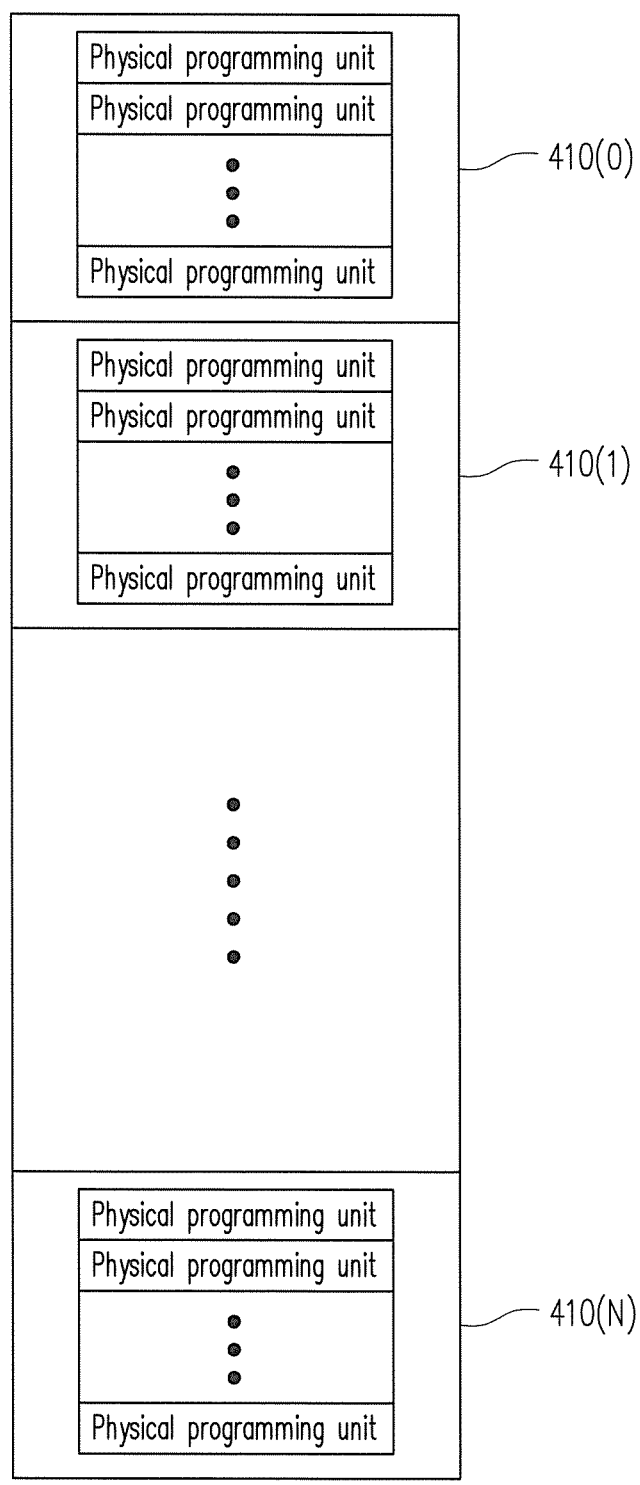

Referring to FIG. 9, the MCCU 404 performs a writing operation on the memory cells 702 of the RNVM module 406 in units of the PPU and performs an erasing operation on the memory cells 702 of the RNVM module 406 in units of the PEU. Specifically, a plurality of PPUs are composed of the memory cells 702 of the RNVM module 406, and a plurality of PEUs 410(0) to 410(N) are composed of the PPUs. The PEU is the minimal unit for erasing. Namely, each PEU contains the least number of memory cells to be erased together. The PPU is the minimum unit for programming. That is, one PPU is the minimum unit for writing data. In particular, in the present exemplary embodiment, before one PEU is erased, the PPUs therein may be programmed once or multiple times. Each PPU usually includes a data bit area and a redundancy bit area. The data bit area containing multiple physical access addresses is used for storing user data, and the redundant bit area is used to store system data (e.g., control information and error checking and correcting code). For example, taking the RNVM module 406 belonging to the 3D TLC NAND flash memory as an example, one lower PPU is composed of the LSBs of the memory cells at the intersections between one word line layer and one bit line string; one center PPU is composed of the CSBs of the memory cells at the intersections between one word line layer and one bit line string; and one upper PPU is composed of the MSBs of the memory cells at the intersections between one word line layer and one bit line string. In other words, the PPU in the PEU of the RNVM module 406 may be divided into the lower PPU, the center PPU and the upper PPU (as shown in FIG. 10).

Figure 11:
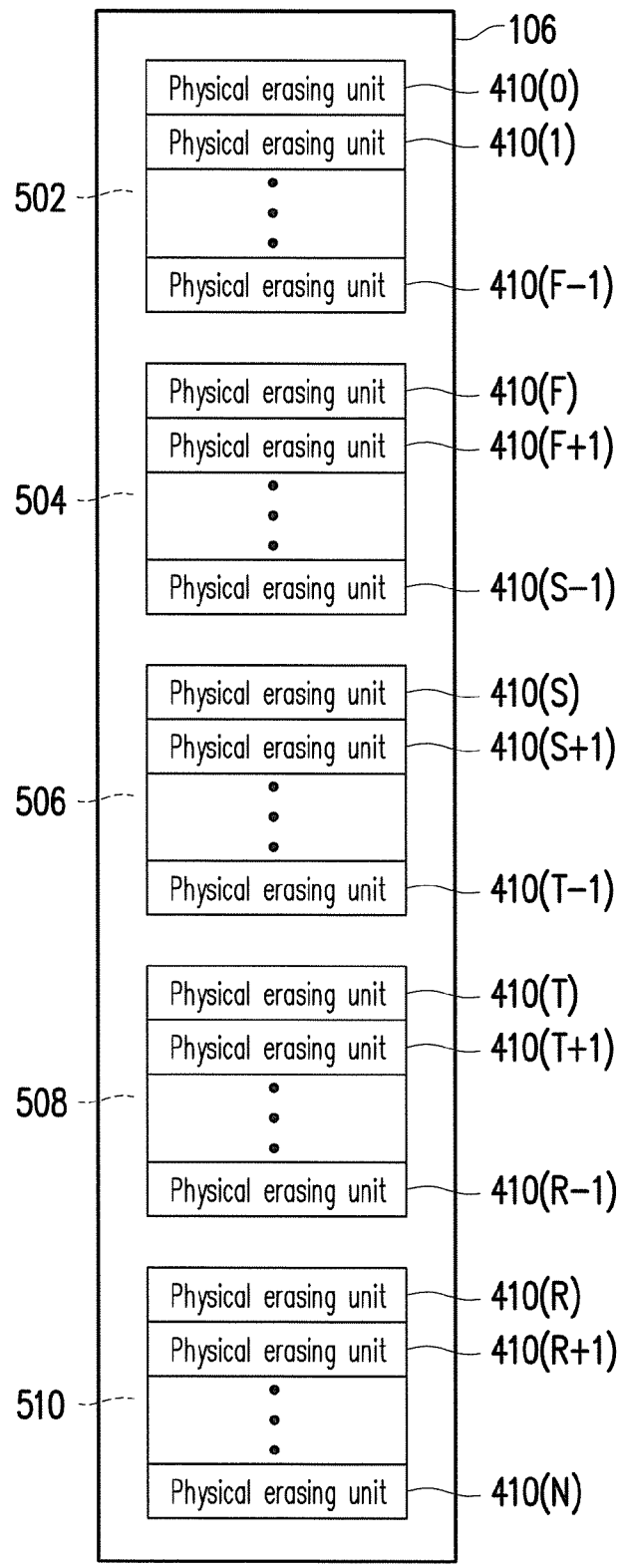

Referring to FIG. 11, in the present exemplary embodiment, the MCCU 404 may logically group the PEUs 410(0) to 410(N) into a data area 502, a spare area 504, a system area 506, a temporary area 508 and a replacement area 510.

The PEUs logically belonging to the data area 502 and the spare area 504 are configured to store data from the host system 11. More specifically, the PEUs of the data area 502 are regarded as the PEUs already stored with the data, whereas the PEUs of the spare area 504 are configured to replace the PEUs of the data area 502. In other words, when the write command and the data to be written are received from the host system 11, the MCCU 404 selects the PEUs from the spare area 504, and writes the data into the selected PEUs in order to replace the PEUs in the data area 502.

The PEUs logically belonging to the system area 506 are configured to record system data. For example, the system data includes information related to manufacturer and model of the RNVM module, the number of PEUs in the RNVM module, the number of the PPUs in each PEU, a firmware code of the memory storage apparatus 10 and so on.

The PEUs logically belonging to the temporary area 508 is configured to temporally store data written from the host system 11.

The PEUs logically belonging to the replacement area 510 are used in a bad PEU replacement procedure for replacing damaged PEUs. More specifically, if the replacement area 510 still includes normal PEUs when the PEUs of the data area 502 are damaged, a MMC 1302 retrieves the normal PEUs from the replacement area 510 for replacing the damaged PEUs.

Particularly, the numbers of the PEUs in the data area 502, the spare area 504, the system area 506, the temporary area 508 and the replacement area 510 may be different from one another, depending on different memory specifications. In addition, it should be understood that, during operations of the memory storage apparatus 10, grouping relations of the PEUs for associating with the data area 502, the spare area 504, the system area 506, the temporary area 508 and replacement area 510 may be dynamically changed. For example, when the damaged PEUs in the spare area 504 are replaced by the PEUs in the replacement area 510, the PEUs originally from the replacement area 510 are then associated with the spare area 504. For example, the PEUs are not assigned to the temporary area 508 in a formatting process, and the MCCU 404 may retrieve the PEUs from the spare area 504 to temporarily store data during the writing operation. The PEUs used to temporarily store the data are regarded as belonging to the temporary area 508.

Figure 12:
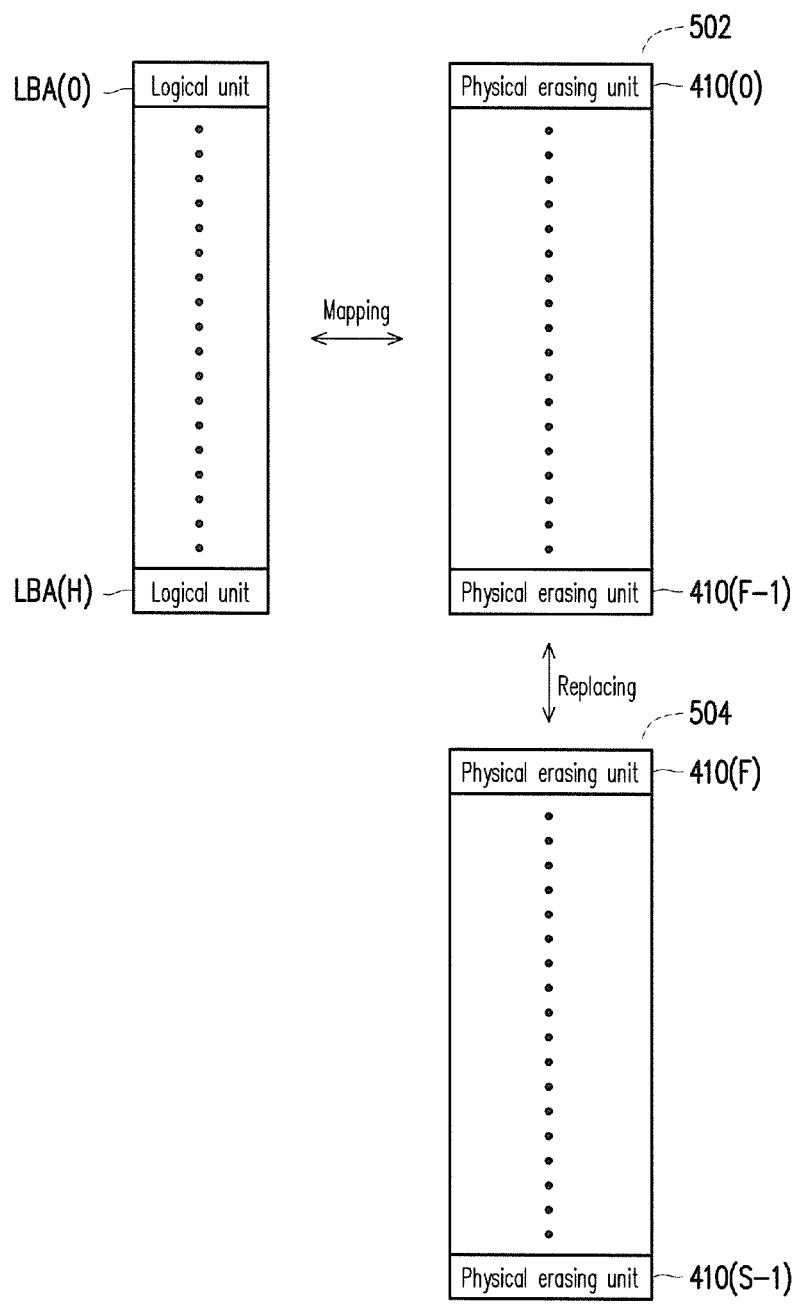

Referring to FIG. 12, the MCCU 404 assigns logical units LAB(0) to LAB(H) for mapping the PEUs in the data area 502. Each of the logical units has a plurality of logical sub-units to be mapped to the PPUs of the corresponding PEU. Further, when the host system 11 intends to write the data into the logical units or update the data stored in the logical units, the MCCU 404 can retrieve one PEU from the spare area 504 as replacement to the PEUs of the data area 502 for writing the data. In the present exemplary embodiment, the logical sub-units may be logical pages or logical sectors.

In order to identify the PEUs to which the data of each logical unit is being stored to, the MCCU 404 can record a mapping between the logical unit and the PEU in the present exemplary embodiment. Further, when the host system 11 intends to access the data in the logical sub-unit, the MCCU 404 can confirm the logical unit to which that logical sub-unit belongs and give a corresponding command sequence to the RNVM module 406 in order to access the data in the PEUs mapped to the logical unit. For instance, in the present exemplary embodiment, the MCCU 404 may store L2P tables into the RNVM module 406 for recording the PEUs mapped to the logical units so the L2P tables may be loaded into the buffer memory for maintenance when the MCCU 404 intends to the access the data.

Figure 13:
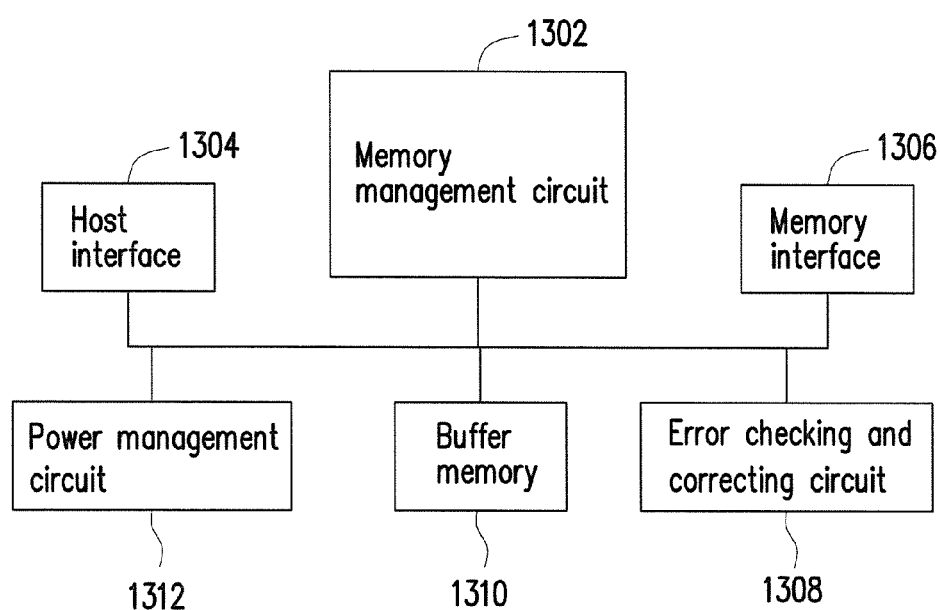
FIG. 13 is a schematic block diagram illustrating a memory control circuit unit according to the first exemplary embodiment.

FIG. 13 is a schematic block diagram illustrating a MCCU according to the first exemplary embodiment. It should be understood that, the structure of the MCCU shown in FIG. 13 is only an example, and the present invention is not limited thereto.

Referring to FIG. 13, the MCCU 404 includes a MMC 1302, a host interface 1304, a memory interface 1306 and an error checking and correcting circuit 1308.

The MMC 1302 is configured to control overall operations of the MCCU 404. Specifically, the MMC 1302 has a plurality of control commands and the control commands are executed to perform various operations such as writing, reading and erasing data during operation of the memory storage apparatus 10. Operations and functions performed by the MMC 1302 in the following description may also be regarded as being performed by the MCCU 404.

In the present exemplary embodiment, the control commands of the MMC 1302 are implemented in form of firmware. For instance, the MMC 1302 has a microprocessor unit (not illustrated) and a ROM (not illustrated), and the control commands are burned into the ROM. During operation of the memory storage apparatus 10, the control commands are executed by the microprocessor to perform operations of writing, reading or erasing data.

In another exemplary embodiment, the control commands of the MMC 1302 may also be stored as program codes in a specific area (e.g., the system area in a memory exclusively used for storing system data) of the RNVM module 406. In addition, the MMC 1302 has a microprocessor unit (not illustrated), the read only memory (not illustrated) and a random access memory (not illustrated). Particularly, the read only memory has an activate code, which is executed by the microprocessor unit to load the control commands stored in the RNVM module 406 to the random access memory of the MMC 1302 when the MCCU 404 is enabled.

Then, the control commands are executed by the microprocessor unit to perform operations, such as writing, reading or erasing data.

Further, in another exemplary embodiment, the control commands of the MMC 1302 may also be implemented in a form of hardware. For example, the MMC 1302 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The MMC is configured to manage the PEUs of the RNVM module 406; the memory writing circuit is configured to give a write command to the RNVM module 406 to write data into the RNVM module 406; the memory reading circuit is configured to give a read command to the RNVM module 406 to read data from the RNVM module 406; the memory erasing circuit is configured to give an erase command to the RNVM module 406 to erase data from the RNVM module 406; and the data processing circuit is configured to process both the data to be written into the RNVM module 406 and the data read from the RNVM module 406.

The host interface 1304 is coupled to the MMC 1302 and configured for receiving and identifying commands and data sent from the host system 11. In other words, the commands and data transmitted by the host system 11 are transmitted to the MMC 1302 via the host interface 1304. In the present exemplary embodiment, the host interface 1304 is compatible with a USB standard. However, it should be understood that the invention is not limited thereto, and the host interface 1304 may also be compatible with a PATA standard, an IEEE 1394 standard, a PCI Express standard, a SD standard, a SATA standard, a UHS-I standard, a UHS-II standard, a MS standard, a Multi Media Card standard, an eMMC standard, a UFS standard, a CF standard, an IDE standard, or other suitable standards for data transmission.

The memory interface 1306 is coupled to the MMC 1302 and configured to access the RNVM module 406. In other words, data to be written into the RNVM module 406 is converted into a format acceptable by the RNVM module 406 via the memory interface 1306.

The error checking and correcting circuit 1308 is coupled to the MMC 1302 and configured to perform an error checking and correcting operation to ensure integrity of data. Specifically, when the MMC 1302 reads data from the RNVM module 406, the error checking and correcting circuit 1308 performs an error correction procedure on the read data. For example, in the present exemplary embodiment, the error checking and correcting circuit 1308 is a low density parity check (LIS) circuit which stores a log likelihood ratio (LL) value look-up table. When the MMC 1302 reads data from the RNVM module 406, the error checking and correcting circuit 1308 performs the error correction procedure according to the read data and corresponding LL values in said look-up table. It should be noted that, in another exemplary embodiment, the error checking and correcting circuit 1308 may also be a Turbo Code circuit.

In an exemplary embodiment of the invention, the MCCU 404 further includes a buffer memory 1310 and a power management circuit 1312.

The buffer memory 1310 is coupled to the MMC 1302 and configured to temporarily store data and commands from the host system 11 or data from the RNVM module 406.

The power management unit 1312 is coupled to the MMC 1302 and configured to control a power of the memory storage apparatus 10.

In the present exemplary embodiment, during the process of writing data into the PEU, each time when giving the command sequence (i.e., a programming command including strings "80", "address", "10", etc.) for applying voltage to one of the word line layers to perform the programming operation, the MCCU 404 only instructs to select one of the bit line strings for the operation so the memory cells at the intersections between said word line layer and said bit line string may be programmed. In particular, in order to improve the reliability of the data by increasing a read margin in a voltage distribution of the programmed memory cells, after completely programming the memory cells at the intersections between one word line layer and one bit line string (i.e., after aforesaid method of pulse writing/verifying threshold voltage is completed), the MCCU 404 programs the memory cells at the intersections between said word line layer and said bit line string for the second time in the present exemplary embodiment. Specifically, after completely programming the memory cells at the intersections between one word line layer and one bit line string, the data on the memory cells at an intersection between said word line layer and said bit line string may be correctly read (i.e., the read command may be given to correctly read the data on the memory cells). However, for increasing the read margin in these memory cells, given that the correct data is already stored in the memory cells at the intersections between said word line layer and said bit line string, the MCCU 404 may give the programming command so aforesaid method of pulse writing/verifying threshold voltage may be used to program the memory cells again. In other words, in the present exemplary embodiment, the MCCU 404 continuously performs the operation of completely programming on the memory cells at the intersections between one word line layer and one bit line string for multiple times.

Figure 14:
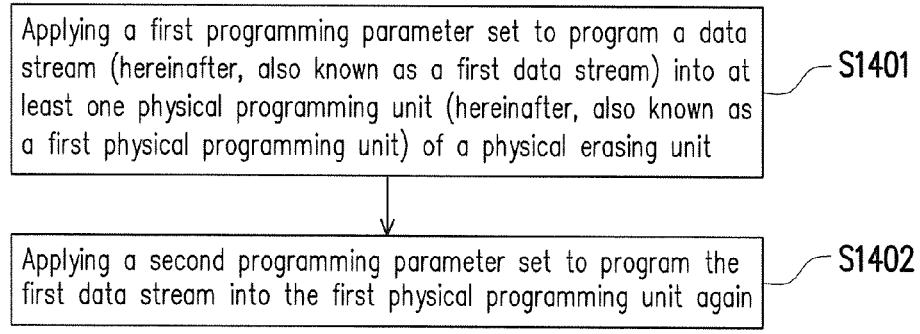
FIG. 14 is a flowchart illustrating a memory programming method according to the first exemplary embodiment.

FIG. 14 is a flowchart illustrating a memory programming method according to the first exemplary embodiment.

With reference to FIG. 14, in step S1401, the MCCU 404 applies a first programming parameter set to program a data stream (hereinafter, also known as a first data stream) into at least one PPU (hereinafter, also known as a first PPU) of a PEU. Herein, the first PPU is composed of the memory cells at the intersections between the first bit line string 704(1) and the first word line layer 706(1). As described above, in the present exemplary embodiment, the RNVM module 406 is the 3D TLC NAND flash memory module. Therefore, three PPUs are composed of the memory cells at the intersections between the first bit line string 704(1) and the first word line layer 706(1), and the three PPUs are completely programmed at the same time.

Next, in step S1402, the MCCU 404 applies a second programming parameter set to program the first data stream into the first PPU again. For example, the MCCU 404 applies the second programming parameter set to program the first data stream into the first PPU again immediately after completely programming the first data stream into the first PPU.

Herein, the second programming parameter set is different from the first programming parameter set. For example, the MCCU 404 may generate a write voltage set of the second programming parameter set (hereinafter, also known as a second write voltage set) according to a write voltage set of the first programming parameter set (hereinafter, also known as a first write voltage set) and a predetermined adjust value. Alternatively, in another exemplary embodiment, the MCCU 404 generates a verify voltage set of the second programming parameter set (hereinafter, also known as a second verify voltage set) according to a verify voltage set of the first programming parameter set (hereinafter, also known as a first verify voltage set) and a predetermined adjust value. Moreover, in another exemplary embodiment, the MCCU 404 generates a write voltage pulse time of the second programming parameter set (hereinafter, also known as a second write voltage pulse time) according to a write voltage pulse time of the first programming parameter set (hereinafter, also known as a first write voltage pulse time) and a predetermined adjust value.

It is worth mentioning that, in the present exemplary embodiment, the second programming parameter set is different from the first programming parameter set. However, the disclosure is not limited thereto. In another exemplary embodiment, the second programming parameter set may also be identical to the first programming parameter set.

Second Exemplary Embodiment

A hardware structure of the memory storage apparatus in the second exemplary embodiment is essentially identical to a hardware structure of the memory storage apparatus in the first exemplary embodiment. The difference between the two is that, the memory storage apparatus in the first exemplary embodiment continuously performs the operation of completely programming on the same memory cells at the intersections between the same word line layer and the same bit line string, whereas the memory storage apparatus in the second exemplary embodiment repeats the programming operation only when finding that a number of error bits occurred in the programmed data is greater than a predefined value after the operation of completely programming is completed. Operations of the memory storage apparatus of the second exemplary embodiment are described in detail below by reference with the drawings and reference numbers of the memory storage apparatus of the first exemplary embodiment.

Figure 15:
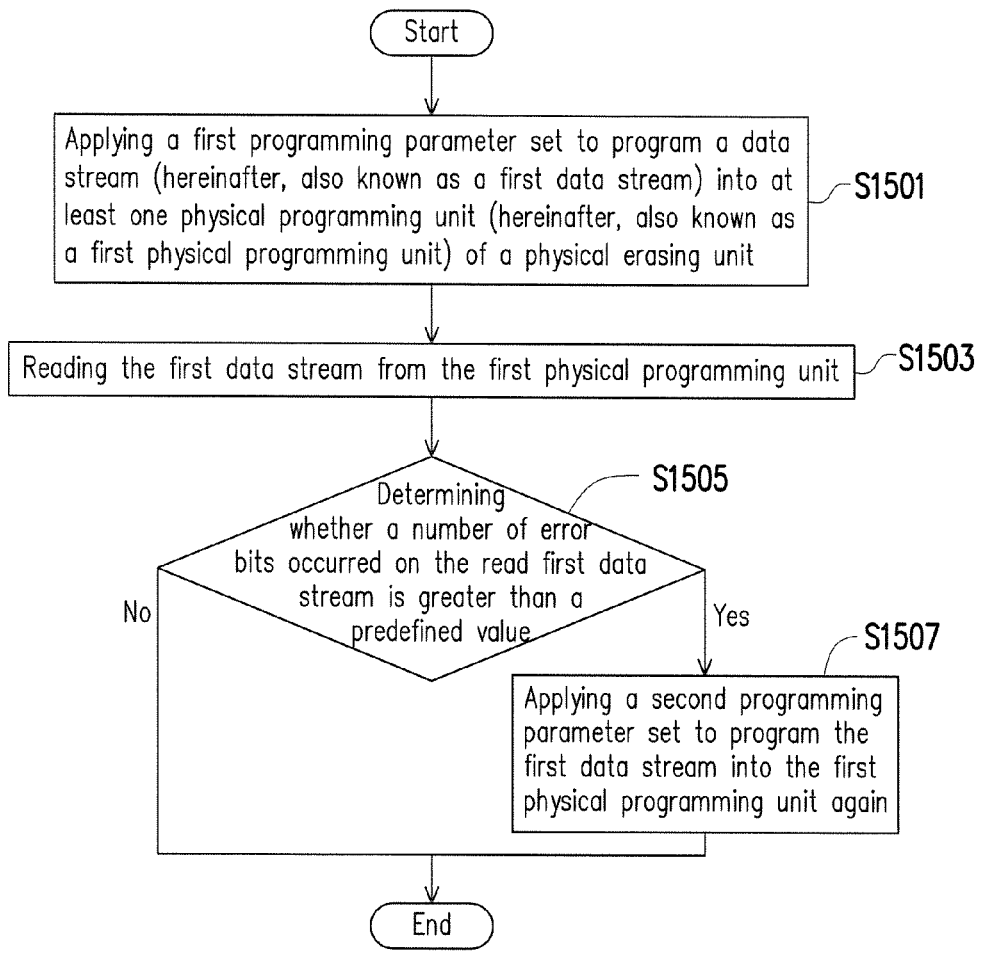
FIG. 15 is a flowchart illustrating a memory programming method according to a second exemplary embodiment.

FIG. 15 is a flowchart illustrating a memory programming method according to the second exemplary embodiment.

With reference to FIG. 15, in step S1501, the MCCU 404 applies a first programming parameter set to program a data stream (hereinafter, also known as a first data stream) into at least one PPU (hereinafter, also known as a first PPU) of a PEU. Herein, the first PPU is composed of the memory cells at the intersections between the first bit line string 704(1) and the first word line layer 706(1).

In step S1503, the MCCU 404 reads the first data stream from the first PPU. Then, in step S1505, the MCCU 404 determines whether the number of error bits occurred in the read first data stream is greater than a predefined value. Specifically, the error checking and correcting circuit 1308 of the MCCU 404 performs an error checking and correcting operation on the read first data stream. For example, if the number of error bits correctable by the error checking and correcting circuit 1308 is the maximum correctable number, the predefined value may be set to be less than or equal to the maximum correctable number of the error checking and correcting circuit 1308.

If the number of error bits occurred in the first data stream is greater than the predefined value, in step S1507, the MCCU 404 applies a second programming parameter set to program the first data stream into the first PPU again.

If the number of error bits occurred in the first data stream is not greater than the predefined value, the flow of FIG. 15 ends.

In summary, according to the data programming method, the MCCU and the memory storage apparatus proposed in the exemplary embodiments of the invention, the programming operation is repeatedly performed on the same memory cells during the process of programming data. As a result, the read margin in the voltage distribution of the memory cells may be increased to improve the reliability of the data.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory programming method for at least one physical erasing unit of a rewritable non-volatile memory module, wherein the at least one physical erasing unit comprises a plurality of word line layers and a plurality of bit line strings, the bit line strings are arranged in a first direction and separated from one another, each bit line string among the bit line strings comprises a plurality of bit lines, the bit lines extend in a second direction, and are arranged in a third direction and separated from one another, the word line layers are stacked in the second direction, the word line layers are separated from one another, a memory cell is provided at an intersection between each of the word line layers and each of the bit lines, at least one physical programming unit is composed of the memory cells at the intersections between any one bit line string among the bit line strings and any one word line layer among the word line layers, the memory programming method comprising:

applying a first programming parameter set to program a first data stream into at least one first physical programming unit of the physical erasing unit, wherein the at least one first physical programming unit is composed of the memory cells at the intersections between a first bit line string among the bit line strings and a first word line layer among the word line layers; and applying a second programming parameter set to program the first data stream into all of the memory cells of the at least one first physical programming unit again after completely programming the first data stream into all of the memory cells of the at least one first physical programming unit, wherein the step of applying the second programming parameter set to program the first data stream into all of the memory cells of the at least one first physical programming unit again comprises:

reading the first data stream from the at least one first physical programming unit after completely programming the first data stream into the at least one first physical programming unit;

performing an error checking and correcting operation on the first data stream read from the at least one first physical programming unit and determining whether a number of error bits occurred in the first data stream read from the at least one first physical programming unit is greater than a predefined value; and performing the step of applying the second programming parameter set to program the first data stream into the at least one first physical programming unit again if the number of error bits occurred in the first data stream read from the at least one first physical programming unit is greater than the predefined value.

2. The memory programming method according to claim 1, wherein the step of applying the second programming parameter set to program the first data stream into all of the memory cells of the at least one first physical programming unit again after completely programming the first data stream into all of the memory cells of the at least one first physical programming unit further comprises:

performing the step of applying the second programming parameter set to program the first data stream into the at least one first physical programming unit again if the number of error bits occurred in the first data stream read from the at least one first physical programming unit is not greater than the predefined value.

3. The memory programming method according to claim 1, wherein the first programming parameter set comprises a first write voltage set, a first write voltage pulse time and a first verify voltage set and the second programming parameter set comprises a second write voltage set, a second write voltage pulse time and a second verify voltage set, wherein the first write voltage set is different from the second write voltage set.

4. The memory programming method according to claim 1, wherein the first programming parameter set comprises a first write voltage set, a first write voltage pulse time and a first verify voltage set and the second programming parameter set comprises a second write voltage set, a second write voltage pulse time and a second verify voltage set, wherein the first verify voltage set is different from the second verify voltage set.

5. The memory programming method according to claim 1, wherein the second programming parameter set is identical to the first programming parameter set.

6. The memory programming method according to claim 1, wherein the memory cells of the at least one first physical programming unit are able to be read normally and data read from the memory cells of the at least one first physical programming unit is identical to the first data stream after completely programming the first data stream into all of the memory cells of the at least one first physical programming unit.

7. A memory control circuit unit for accessing a rewritable non-volatile memory module, the memory control circuit unit comprising:

a host interface configured to couple to a host system;

a memory interface configured to couple to the rewritable non-volatile memory module, wherein the rewritable non-volatile memory module comprises at least one physical erasing unit, the at least one physical erasing unit comprises a plurality of word line layers and a plurality of bit line strings, the bit line strings are arranged in a first direction and separated from one another, each bit line string among the bit line strings comprises a plurality of bit lines, the bit lines extend in a second direction, and are arranged in a third direction and separated from one another, the word line layers are stacked in the second direction, the word line layers are separated from one another, a memory cell is provided at an intersection between each of the word line layers and each of the bit lines, and at least one physical programming unit is composed of the memory cells at the intersections between any one bit line string among the bit line strings and any one word line layer among the word line layers; and a memory management circuit, coupled to the host interface and the memory interface, wherein the memory management circuit is configured to give a first command sequence for applying a first programming parameter set to program a first data stream into at least one first physical programming unit of the physical erasing unit, wherein the at least one first physical programming unit is composed of the memory cells at the intersections between a first bit line string among the bit line strings and a first word line layer among the word line layers, wherein the memory management circuit is further configured to give a second command sequence for applying a second programming parameter set to program the first data stream into all of the memory cells of the at least one first physical programming unit again after completely programming the first data stream into all of the memory cells of the at least one first physical programming unit, wherein in the operation of applying the second programming parameter set to program the first data stream into all of the memory cells of the at least one first physical programming unit again after completely programming the first data stream into all of the memory cells of the at least one first physical programming unit, the memory management circuit reads the first data stream from the at least one first physical programming unit after completely programming the first data stream into the at least one first physical programming unit, performs an error checking and correcting operation on the first data stream read from the at least one first physical programming unit and determines whether a number of error bits occurred in the first data stream read from the at least one first physical programming unit is greater than a predefined value, wherein the memory management circuit performs the operation of applying the second programming parameter set to program the first data stream into the at least one first physical programming unit again if the number of error bits occurred in the first data stream read from the at least one first physical programming unit is greater than the predefined value.

8. The memory control circuit unit according to claim 7, wherein in the operation of applying the second programming parameter set to program the first data stream into all of the memory cells of the at least one first physical programming unit again after completely programming the first data stream into all of the memory cells of the at least one first physical programming unit, the memory management circuit performs the operation of applying the second programming parameter set to program the first data stream into the at least one first physical programming unit again if the number of error bits occurred in the first data stream read from the at least one first physical programming unit is not greater than the predefined value.

9. The memory control circuit unit according to claim 7, wherein the first programming parameter set comprises a first write voltage set, a first write voltage pulse time and a first verify voltage set and the second programming parameter set comprises a second write voltage set, a second write voltage pulse time and a second verify voltage set, wherein the first write voltage set is different from the second write voltage set.

10. The memory control circuit unit according to claim 7, wherein the first programming parameter set comprises a first write voltage set, a first write voltage pulse time and a first verify voltage set and the second programming parameter set comprises a second write voltage set, a second write voltage pulse time and a second verify voltage set, wherein the first verify voltage set is different from the second verify voltage set.

11. The memory control circuit unit according to claim 7, wherein the second programming parameter set is identical to the first programming parameter set.

12. The memory control circuit unit according to claim 7, wherein the memory cells of the at least one first physical programming unit are able to be read normally and data read from the memory cells of the at least one first physical programming unit is identical to the first data stream after completely programming the first data stream into all of the memory cells of the at least one first physical programming unit.

13. A memory storage apparatus, comprising:
a connection interface unit configured to couple to a host system;
a rewritable non-volatile memory module, wherein the rewritable non-volatile memory module comprises at least one physical erasing unit, the at least one physical erasing unit comprises a plurality of word line layers and a plurality of bit line strings, the bit line strings are arranged in a first direction and separated from one another, each bit line string among the bit line strings comprises a plurality of bit lines, the bit lines extend in a second direction, and are arranged in a third direction and separated from one another, the word line layers are stacked in the second direction, the word line layers are separated from one another, a memory cell is provided at an intersection between each of the word line layers and each of the bit lines, and at least one physical programming unit is composed of the memory cells at the intersections between any one bit line string among the bit line strings and any one word line layer among the word line layers; and
a memory control circuit unit, coupled to the connection interface unit and the rewritable non-volatile memory module,
wherein the memory control circuit unit is configured to give a first command sequence for applying a first programming parameter set to program a first data stream into at least one first physical programming unit of the physical erasing unit, wherein the at least one first physical programming unit is composed of the memory cells at the intersections between a first bit line string among the bit line strings and a first word line layer among the word line layers,
wherein the memory control circuit unit is further configured to give a second command sequence for applying a second programming parameter set to program the first data stream into all of the memory cells of the at least one first physical programming unit again after completely programming the first data stream into all of the memory cells of the at least one first physical programming unit,
wherein in the operation of applying the second programming parameter set to program the first data stream into all of the memory cells of the at least one first physical programming unit again after completely programming the first data stream into all of the memory cells of the at least one first physical programming unit, the memory control circuit unit reads the first data stream from the at least one first physical programming unit after completely programming the first data stream into the at least one first physical programming unit, performs an error checking and correcting operation on the first data stream read from the at least one first physical programming unit and determines whether a number of error bits occurred in the first data stream read from the at least one first physical programming unit is greater than a predefined value,
wherein the memory control circuit unit performs the operation of applying the second programming parameter set to program the first data stream into the at least one first physical programming unit again if the number of error bits occurred in the first data stream read from the at least one first physical programming unit is greater than the predefined value.

14. The memory storage apparatus according to claim 13, wherein in the operation of applying the second programming parameter set to program the first data stream into all of the memory cells of the at least one first physical programming unit again after completely programming the first data stream into all of the memory cells of the at least one first physical programming unit, the memory control circuit unit
performs the operation of applying the second programming parameter set to program the first data stream into the at least one first physical programming unit again if the number of error bits occurred in the first data stream read from the at least one first physical programming unit is not greater than the predefined value.

15. The memory storage apparatus according to claim 13, wherein the first programming parameter set comprises a first write voltage set, a first write voltage pulse time and a first verify voltage set and the second programming parameter set comprises a second write voltage set, a second write voltage pulse time and a second verify voltage set, wherein the first write voltage set is different from the second write voltage set.

16. The memory storage apparatus according to claim 13, wherein the first programming parameter set comprises a first write voltage set, a first write voltage pulse time and a first verify voltage set and the second programming parameter set comprises a second write voltage set, a second write voltage pulse time and a second verify voltage set, wherein the first verify voltage set is different from the second verify voltage set.

17. The memory storage apparatus according to claim 13, wherein the second programming parameter set is identical to the first programming parameter set.

18. The memory storage apparatus according to claim 13, wherein the memory cells of the at least one first physical programming unit are able to be read normally and data read from the memory cells of the at least one first physical programming unit is identical to the first data stream after completely programming the first data stream into all of the memory cells of the at least one first physical programming unit.

* * * * *